United States Patent
Ramaraju et al.

(10) Patent No.: US 9,425,829 B2
(45) Date of Patent: Aug. 23, 2016

(54) ADAPTIVE ERROR CORRECTION CODES (ECCS) FOR ELECTRONIC MEMORIES

(71) Applicant: Freescale Semiconductor, Inc., Austin, TX (US)

(72) Inventors: Ravindraraj Ramaraju, Round Rock, TX (US); George P. Hoekstra, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 113 days.

(21) Appl. No.: 14/485,624

(22) Filed: Sep. 12, 2014

(65) Prior Publication Data

US 2016/0080002 A1 Mar. 17, 2016

(51) Int. Cl.
| | |
|---|---|
| G11C 29/00 | (2006.01) |
| H03M 13/35 | (2006.01) |
| G06F 11/10 | (2006.01) |
| G06F 3/06 | (2006.01) |
| H03M 13/11 | (2006.01) |
| H03M 13/15 | (2006.01) |

(52) U.S. Cl.
CPC ............ *H03M 13/353* (2013.01); *G06F 3/064* (2013.01); *G06F 3/0619* (2013.01); *G06F 3/0683* (2013.01); *G06F 11/1076* (2013.01); *H03M 13/1102* (2013.01); *H03M 13/152* (2013.01); *H03M 13/1515* (2013.01)

(58) Field of Classification Search
CPC combination set(s) only.
See application file for complete search history.

(56) References Cited

U.S. PATENT DOCUMENTS

| | | | | |
|---|---|---|---|---|
| 6,239,931 | B1 * | 5/2001 | Chung | G11B 20/1883 360/53 |
| 8,266,498 | B2 | 9/2012 | Moyer | |
| 8,549,384 | B1 * | 10/2013 | Huang | G06F 11/1012 365/201 |
| 2008/0215952 | A1 * | 9/2008 | Bae | G11C 16/22 714/756 |
| 2013/0080857 | A1 * | 3/2013 | Lee | G06F 11/1068 714/773 |
| 2013/0117632 | A1 * | 5/2013 | Fujinami | G06F 11/1012 714/763 |
| 2013/0246878 | A1 * | 9/2013 | Pancholi | H04N 19/13 714/752 |
| 2014/0082456 | A1 * | 3/2014 | Liu | G06F 11/1012 714/764 |
| 2015/0286528 | A1 * | 10/2015 | Cai | G06F 11/1076 714/763 |

OTHER PUBLICATIONS

Alameldeen et al.,"Energy-Efficient Cache Design Using Variable-Strength Error-Correcting Codes," ISCA'11, Jun. 4-8, 2011, San Jose, California, USA.
Chen et al., "An Adaptive-Rate Error Correction Scheme for NAND Flash Memory," VLSI Test Symposium, 2009. VTS '09. 27th IEEE.
Wilkerson et al., "Reducing Cache Power with Low-Cost, Multi-bit Error-Correcting Codes," ISCA'10, Jun. 19-23, 2010, Saint Malo, France.

(Continued)

*Primary Examiner* — Guerrier Merant

(57) ABSTRACT

Systems and methods for adaptive error correction codes (ECCs) for electronic memories. In some embodiments, a memory device, may include a first memory having a plurality of address locations, each of the plurality of address locations having a number of storage bits configured to store data and one or more error correction bits corresponding to the data; and a second memory distinct from the first memory, the second memory having a plurality of entries, each of the plurality of entries configured to store one or more operation code bits relating to data stored at a corresponding address location in the first memory, the one or more operation code bits identifying an error correction scheme used to generate the one or more error correction bits at the corresponding address location in the first memory.

17 Claims, 5 Drawing Sheets

(56) References Cited

OTHER PUBLICATIONS

Duann, "Error Correcting Techniques for Future Error Correcting Techniques for Future NAND Flash Memory in SSD Applications NAND Flash Memory in SSD," Flash Memory Summit, Aug. 2009, Santa Clara, CA, USA.

Yoon et al., "FREE-p: Protecting Non-Volatile Memory against both Hard and Soft Errors," Non-Volatile Memories Workshop 2011, Austin, TX, 2011.

* cited by examiner

ADAPTIVE ERROR CORRECTION CODES (ECCS) FOR ELECTRONIC MEMORIES

FIELD

This disclosure relates generally to electronic memory design, and more specifically, to systems and methods for adaptive error correction codes (ECCs) for electronic memories.

BACKGROUND

The following background discussion sets forth the inventors' own knowledge of certain technologies and problems associated therewith. Accordingly, this discussion is not an admission of prior art, and it is not an admission of the knowledge available to a person of ordinary skill in the art.

As production geometries of processor systems with their associated memories decrease, the opportunities for defects in the finished products increase. These defects, along with other physical events (e.g., cosmic ray passage), can result in increasing bit error rates in system memories. Along with increasing single bit error rates are the increasing probability of double bit errors in a given area of memory.

Today's high density memories may be subject to increased incidents of bit errors than lower density memories. Process technologies used to manufacture high density memories can result in defects that cause persistent weak bits. Further, multiple neighboring bits may be subject to these defects due to processing. In addition, transient bit errors can affect multiple neighboring bits in high-density memories.

Single bit error correction methods have been used to correct occurrences of errors in a single bit of an area of memory. Single bit error correction methods, such as Hamming code methods, are attractive because they may be performed in a manner that has a minimal impact on memory latency (e.g., in a single clock cycle). But single bit error correction methods cannot correct both a transient bit error and a persistent weak bit error occurring in the same area of memory. In a circumstance where a region of memory has a double bit (or higher) error, and only single bit error correction is used, that region of memory will require reloading from a data source to correct the error. Such reloading increases memory latency due to cycles spent requesting, reading, and loading the data from the source to the region of memory.

To resolve issues related to double bit errors, polynomial code based error correction codes (ECCs) or methods, such as the Bose-Chaudhuri-Hocquenghem (BCH) code, may be used. These double bit error correction methods have an advantage over single bit error correction methods in that they can significantly improve memory reliability. For example, double bit error correction methods can correct both a transient bit error and a persistent weak bit error in a same area of memory. While double bit error correction methods are robust, the process of determining the location of the errors and correcting the errors are non-trivial and can result in significantly longer memory latencies than those found in single bit error correction methods. Thus, traditionally, a tradeoff has been required between memory latency and memory reliability through correction of higher numbers of bit errors.

In non-volatile memories, failures increase with aging. For example, as flash memory is reprogrammed over a number of cycles, correction of higher numbers of bit errors requires more correction capability with a corresponding increase in the number of parity bits. If the number of bits allocated for parity increases, however, the number of bits available for storing data is reduced.

BRIEF DESCRIPTION OF THE DRAWINGS

The present invention(s) is/are illustrated by way of example and is/are not limited by the accompanying figures, in which like references indicate similar elements. Elements in the figures are illustrated for simplicity and clarity and have not necessarily been drawn to scale.

DETAILED DESCRIPTION

Embodiments discussed herein provide systems and methods for using different Error Correction Codes or "ECCs" for electronic memories. Different ECCs may be used in an adaptive manner configured to change over time, for example, as the memory ages and more complex ECCs are required. Generally speaking, ECCs may be changed on a page-by-page or block-by-block basis (or other suitable subsection size or sector of a memory array) as the volume of errors in a given page or block of the memory increases. Moreover, an operation code or "opcode" (e.g., a machine language instruction) may direct error correction logic to use the same coding the scheme that was used to generate the stored parity bits.

In some implementations, an initial or default ECC scheme may be employed to correct fewer bits with lower latency and higher parity bits. A next ECC scheme may then be used for a given block or page when the error rate of that block or page exceeds the correction capability. ECCs may continue to be switched following a predetermined or ordered sequence, for instance, from least to most complex (also from least to most latency), until a maximum error correction capability is reached.

When a page in a block meets or exceeds the error correction capability, that page may be marked as faulty and rest of the pages in that block may be automatically updated to the higher correction scheme with updated parity bits, independently of the actual error status of those remaining pages. During a write operation into a page in the block, the page or block's opcode is read and a parity bit(s) corresponding to that scheme is/are generated and stored.

In some implementations, information for the opcodes used for one set of subsection sizes or sectors of a memory array may be stored in the memory array in a space set aside for ECC information in the memory array. In other implementations, information for the opcodes used for another set of subsection sizes or sectors of the memory array may be stored in a secondary memory outside the memory array. The secondary memory may be implemented using a non-volatile memory device that is external to the memory where the data is stored. The information in the secondary memory may be written and saved in the memory device when the system is powered down and restored from the memory device when the system is powered-up.

Figure 1:
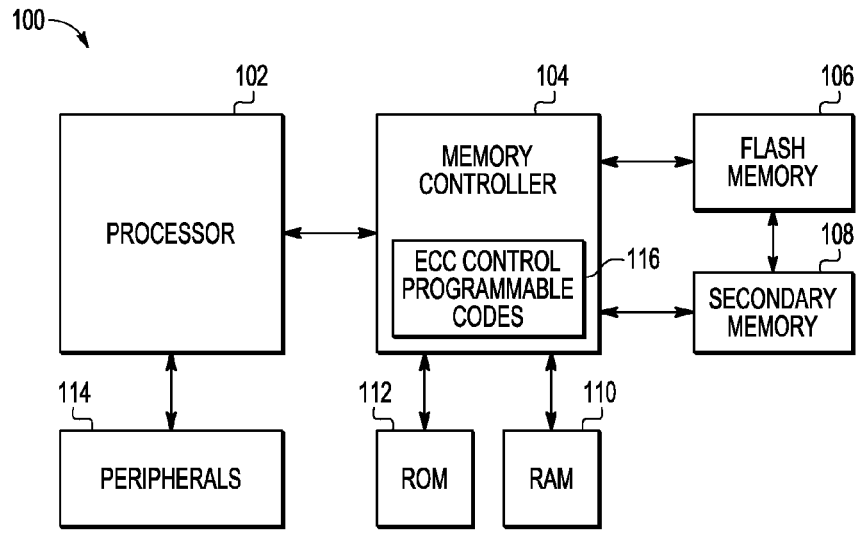
FIG. 1 illustrates an example of a data processing system according to some embodiments.

FIG. 1 is a simplified block diagram illustrating a data processing system 100 according to some embodiments. Data processing system 100 includes processor 102, memory controller 104 with error correction code (ECC) control 116, non-volatile memory (NVM) 106 such as flash memory, secondary memory 108, random access memory (RAM) 110, read-only memory (ROM) 112, and peripheral modules 114. Processor 102 is configured to communicate with peripheral modules 114 and memory controller 104 over one or more buses. Memory Controller 104 is configured to communicate with flash memory 106, secondary memory 108, RAM 110, and ROM 112 via one or more buses. Secondary memory 108 may be implemented using static random access memory (SRAM), NOR flash, or other suitable non-volatile memory.

ECC control 116 is configured to provide both error encoding and error decoding functionality. As data is received from memory (e.g., flash memory 106, RAM 110 or ROM 112) or processor 102, ECC control 116 may generate parity bits, also referred to as error correction bits, for use in subsequent error checking and correction. The mechanism for generating the parity bits is associated with the method used for decoding those parity bits during subsequent memory access and accompanying error correction and detection. For each address, both the data retrieved from memory (or generated by processor) and a fixed number of parity bits associated with the data are stored in an entry. Parity bits associated with correcting error(s) in segments of flash memory 106 of a specified size may be stored in flash memory 106 in association with their related data.

In some implementations, parity bits associated with correcting error(s) in segments of flash memory 106 of another specified size may be stored in secondary memory 108. For example, parity bits in the flash memory 106 entry may be used for relatively simple error correction codes for relatively small segments of flash memory 106, such as single bit errors in sectors. When more than one or two errors are expected in the memory bits, such as after a specified number of write and/or read accesses of the array have occurred, error correction bits used in more complex ECC to correct multiple errors may be stored in secondary memory 108.

The ECCs used to correct errors in the larger segments may have better efficiency and may be capable of correcting burst errors in the segments than ECC used to correct errors in smaller segments of flash memory 106. The error correction bits in secondary memory 108 can also be updated as the memory cells in flash memory 106 further age due to continued write and read accesses. For example, error correction bits for the Hamming ECC can initially be stored in secondary memory 108, updated at a first specified age to error correction bits for the Reed-Solomon algorithm, and further updated at a second specified age to error correction bits for the BCH algorithm.

The number of bits in the flash memory 106, and the size and number of memory segments, can vary depending upon the implementation of system 100. The concepts described herein are not limited to any particular size of memory region or memory segment. Further, embodiments described herein are not limited solely to correction of any particular type of memory (e.g., flash memory).

Figure 2:
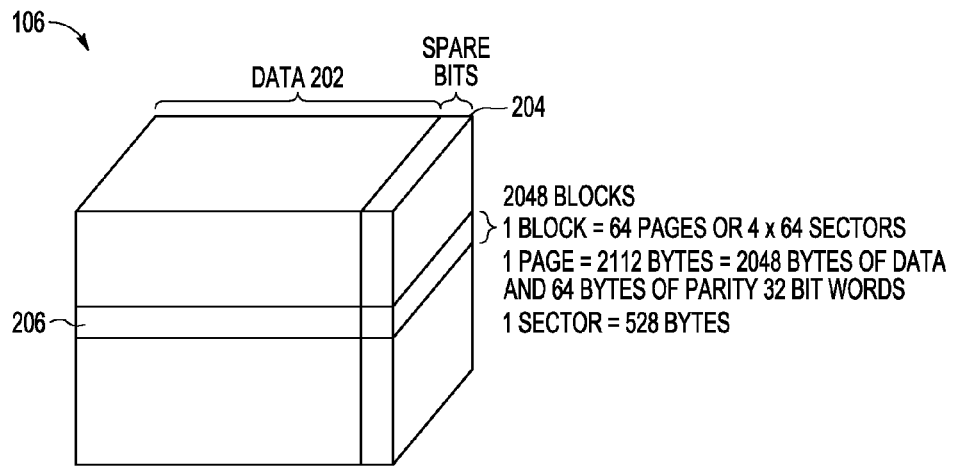
FIG. 2 illustrates an example of a non-volatile memory with space for data and parity information for each entry in a non-volatile memory according to some embodiments.

FIG. 2 illustrates an embodiment of flash memory 106 that may be used in the data processing system of FIG. 1 including data bits portion 202 for storing data for each entry in memory 106 and spare bits portion 204 for storing parity information and/or opcodes for each entry in memory 106. Flash memory 106 may be divided into two or more segments and subsegments 206 such as blocks, pages, sectors, or other suitable divisions. In the example shown, flash memory 106 includes 2048 blocks. Each block may be divided into a number of pages, for example, 64 pages with each page including 2112 bytes. Alternatively, each block may be divided into a number of sectors, for example, 256 sectors with each sector including 528 bytes. As used herein, the term "segment" can refer to a page, a sector, or any other suitable division of flash memory 106.

Memory cells in flash memory 106 may be programmed and erased multiple times. As the number of program/erase cycles increases, some of the memory cells may require increased voltages during program and/or erase operations. In some cases, one or more of the cells may fail during a program or erase operation. The number of bits that fail may increase as flash memory 106 ages. In other cases, one or more transmission errors may occur when the data is sent to flash memory 106, causing one or more bits in the data to be dropped or scrambled. In these cases, an error correction code may be used to detect whether there is an error in the data, and to correct the data if there is an error. Spare bits 204 are reserved for each entry, but it is desirable to keep the number of spare bits 204 to a minimum so that more space is available to hold data in data portion 202. Most of the bits in each segment 206 are allocated to data portion 202 and the rest of the bits are allocated to spare bits portion 204.

Figure 3:
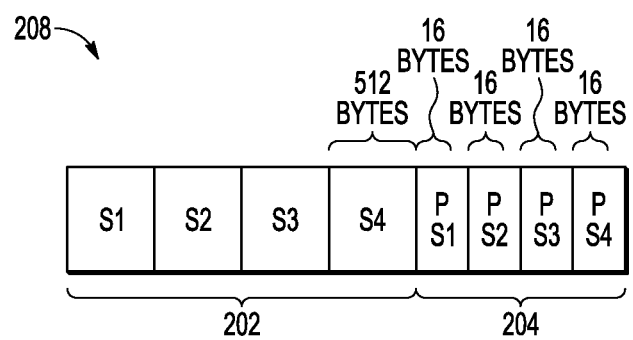
FIG. 3 illustrates an example of an entry in a non-volatile memory according to some embodiments.

FIG. 3 illustrates an embodiment of segment 206 of flash memory 102 that includes four sectors S1-S4 in data portion 202 and 16 parity bits for each sector S1-S4 in spare bits portion 204. Each sector S1-S4 includes a number of words of data. A word can include 8, 16, 32, 64 or other suitable number of bits. A parity bit is added to a group of bits to indicate whether the number of bits in the group with a value of one or zero is even or odd. If the parity matches the actual data, then no error is detected. If the parity does not match the actual data, then an error is detected and may be corrected using correction logic in ECC control 116 (FIG. 1). In the example shown, each sector S1-S4 includes 512 bytes in data portion 202 and 16 bytes in parity portion 204. In other embodiments, each sector S1-S4 may include another suitable number of bits is data portion 202 and parity portion 204.

Again, each of spare or parity bits portions 204 is associated with a corresponding one of sectors S1-S4 in data portion 202. As such, a given one of spare bit portions 204 may include parity bits calculated based upon the application of a particular ECC scheme upon the data stored in a corresponding one of data bit portions 202. Moreover, the given spare bit portion may include one or more opcode bits (e.g., 1, 2, or 3 bits) that identify the particular ECC scheme currently used for the corresponding one of sectors S1-S4 in data portion 202.

In some embodiments, if additional space is required to use more complex error correction codes, the space allocated in data portion 202 and parity portion 204 may remain the same while the additional information for the error correction code may be stored in secondary memory 108 (FIG. 1).

Figure 4:
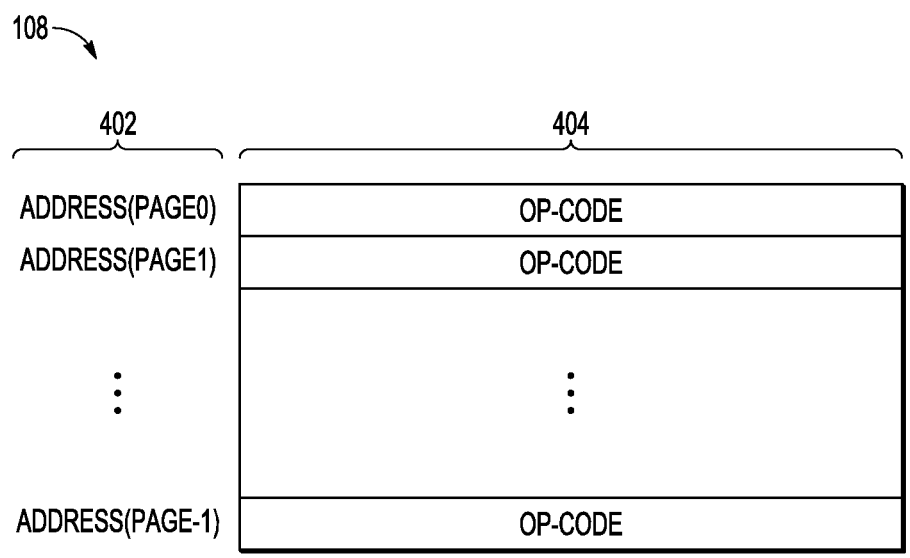
FIG. 4 illustrates an example of a secondary memory with extended error correction code information according to some embodiments.

FIG. 4 illustrates an example of secondary memory 108 with error correction code (ECC) information, according to some embodiments. Secondary memory 108 includes a number of pages or entries 402, with each entry 402 having an address and including a corresponding opcode field 404. Note that entries 402 may include other fields in addition to or instead of those shown in the example. In some cases, opcode fields 404 may each include 8 bits, but in other cases fields 404 may include any suitable number of bits.

In some implementations, opcodes 404 associated with a segment of flash memory 106, such as a sector or page 402, may be used as an index into secondary memory 108 to find the error correction information to be used for the corresponding segment of the memory 106. For example, the ECC information for page 0 of flash memory 102 may be found in the first entry 402 of secondary memory 108, the ECC information for page 1 of flash memory 102 may be found in the second entry 402 of secondary memory 108, and so on.

During a read access of flash memory 106, single bit error correction, double bit error detection (SEC-DED), or the like may be performed on each of the memory segments, for example. Such SEC-DED may be performed using a linear error-correcting code such as a Hamming code or other suitable ECC scheme.

If no data corruption errors in any of the memory segments are detected, then the stored data may be used to service a memory access request. For example, if no bit errors are detected in any segment, the corrected data may be provided back to memory controller 104. If, however, a bit error is detected in any of the memory segments, a determination is then made whether to reload the data from system memory such as ROM 112 or RAM 110 if the data has not been modified, or to otherwise handle the error if the data has been modified (e.g., reboot the system). The error correction bits determined by the ECC scheme chosen for the segment may be placed in a corresponding entry in secondary memory 108.

Note that the scope of embodiments described herein is not limited to specific error correction and detection methods.

In order to perform such error correction and detection, a first set of parity bits are stored in flash memory 106 with each memory segment during error encoding. The number of parity bits depends upon the size of the memory segment and the type of error correction used. For example, for a 512 byte memory data segment, up to an additional 16 parity bytes may be available in a spare area. In some embodiments, additional parity bits for one or more alternative ECCs for larger segments of data may be stored in secondary memory 108, thus providing flexibility in correcting errors in different sizes of segments of flash memory 106 while retaining sufficient space in flash memory 106 to store data with a fixed number of parity bits in the spare area.

Figure 5:
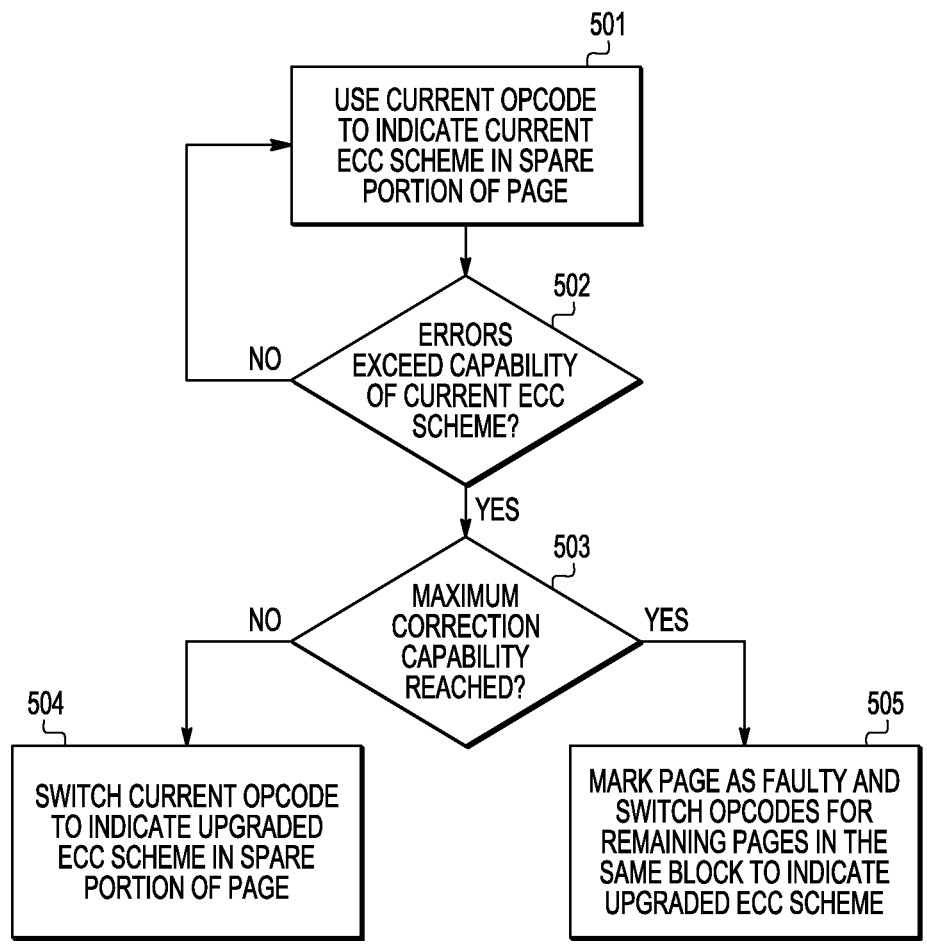
FIG. 5 illustrates an example of a method for performing a read memory access using error correction code information, according to some embodiments.

FIG. 5 illustrates an example of a method for performing a read memory access using error correction code information. In some embodiments, method 500 may be performed, at least in part, by memory controller 104 of FIG. 1. At block 501, method 500 includes storing a current opcode in a given entry of second memory 108 to indicate a current ECC scheme used to read and/or write data in a data bit portion of a corresponding address location in first memory 106. At block 502, method 500 includes determining that the data bit portion has a number of data corruption errors that exceeds a correction capability the current ECC scheme identified by the opcode stored in second memory 108. For example, the number of errors may be 2 bits, but the current ECC scheme may be capable or correcting only 1 bit errors.

At block 503, method 500 includes determining whether the current ECC scheme in use for the particular location address is the most advanced available scheme (e.g., most computationally complex and/or capable of correcting the greatest number of errors). If not, then at block 504, method 500 includes switching the current opcode to indicate an updated ECC scheme in second memory 108. Otherwise, at block 505, method 500 includes making the page as faulty or unusable; which in some cases may initiate a memory replacement process or the like. Further, in some cases, still at block 505, method 500 may include switching opcodes for remaining pages of the same block to indicate an upgraded ECC scheme for those pages.

In some embodiments, proactive upgrading of ECC schemes for other pages of a same block (where a given page has had its ECC upgraded) may occur prior to reaching the maximum correction capability of all available ECC schemes. That is, whenever a given ECC scheme is upgraded for a given page because of detected errors, ECC schemes or the remaining pages of the same block may also be upgraded despite not having yet presented the same number or errors.

In some implementations, available ECCs may be ordered by error correction capability, so that opcode and ECC scheme upgrades follow the order. An example of such order includes, but is not limited to, a Reed-Solomon code, a Mutually Orthogonal Latin Squares (MOLS) code, a Bose-Chaudhuri-Hocquenghem (BCH) code, and a Low-Density Parity-Check (LDPC) code.

Figure 6:
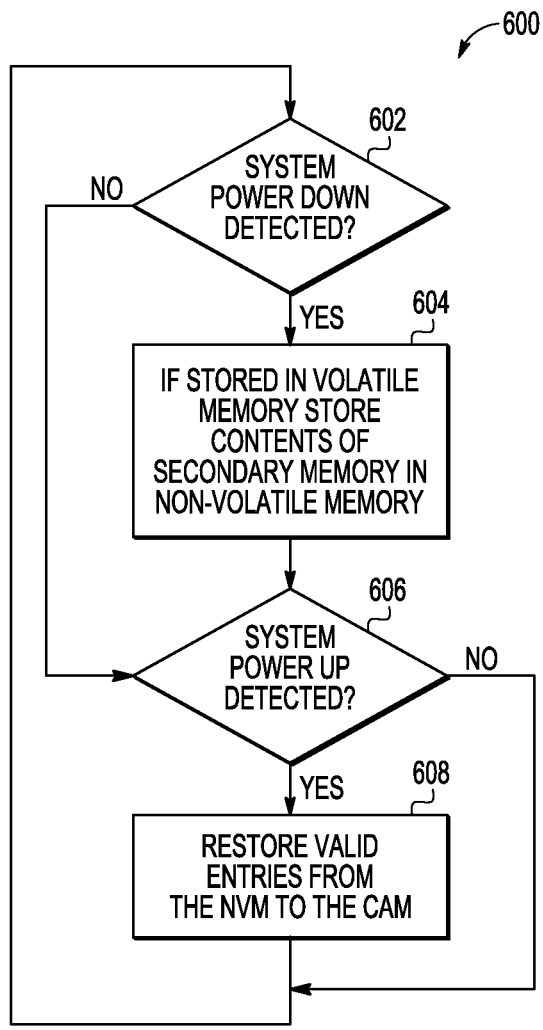
FIG. 6 illustrates an example of a method for saving and restoring entries in CAM during power down and power up modes according to some embodiments.

FIG. 6 illustrates an embodiment of a method 600 for saving and restoring entries 402 (FIG. 4) in secondary memory 108, usable in embodiments of the system of FIG. 1. Process 602 determines whether a system power down has been detected. If a power down is detected, process 604 includes storing the contents of secondary memory 108 in non-volatile memory, such as flash memory 106 or other suitable non-volatile memory in system 100. If no power down is detected, or process 604 is complete, method 600 transitions to process 606, which includes detecting whether a system power up is detected. If a power up is detected, process 608 restores valid entries from the non-volatile memory to secondary memory 108. If a power up is not detected in process 606 or power up is detected and process 608 is complete, method 600 transitions to process 602. Method 600 may only need to be performed when secondary memory 108 is a volatile type of memory that erases data when power is not available.

By now it should be appreciated that in some embodiments, there has been provided that maintains a separate secondary memory 108 with addresses that index each page of flash memory 106. The secondary memory 108 includes ECC information for the page while the flash memory includes ECC information for the sector. If there are errors at the sector level, the ECC information in the flash memory is used to correct errors in the sector. If the ECC information in the flash memory 106 does not correct the errors, the ECC information in the secondary memory 108 is used, and the corrections are made on a page. Different codes could be employed using ECC information in the secondary memory 108, enabling more powerful codes to be employed as the memory wears out.

Because the apparatus(es) implementing the embodiments described herein is/are, composed of electronic components and circuits known to those skilled in the art, circuit details will not be explained in any greater extent than that considered necessary as illustrated above, for the understanding and appreciation of the underlying concepts of this disclosure and in order not to obfuscate or distract from the teachings set forth herein.

The term "program," as used herein, is defined as a sequence of instructions designed for execution on a computer system. A program, or computer program, may include a subroutine, a function, a procedure, an object method, an object implementation, an executable application, an applet, a servlet, a source code, an object code, a shared library/dynamic load library and/or other sequence of instructions designed for execution on a computer system.

Some of the above embodiments, as applicable, may be implemented using a variety of different information processing systems. For example, although FIG. 1 and the discussion thereof describe an exemplary information processing architecture, this exemplary architecture is presented merely to provide a useful reference in discussing various aspects of the invention. Of course, the description of the architecture has been simplified for purposes of discussion, and it is just one of many different types of appropriate architectures that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements.

Thus, it is to be understood that the architectures depicted herein are merely exemplary, and that in fact many other architectures may be implemented which achieve the same functionality. In an abstract, but still definite sense, any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Also for example, in one embodiment, the illustrated elements of system 100 are implemented with circuitry located on a single integrated circuit or within a same device. Alternatively, the systems and subsystems may include any number of separate integrated circuits or separate devices interconnected with each other. For example, RAM 110, ROM 112, secondary memory 108 and flash memory 106 may be located on a same integrated circuit as processor 102 or on a separate integrated circuit or located within another peripheral or slave discretely separate from other elements of system 100. Peripheral modules 114 may also be located on separate integrated circuits or devices. Also for example, system 100 or portions thereof may be soft or code representations of physical circuitry or of logical representations convertible into physical circuitry. As such, the systems may be embodied in a hardware description language of any appropriate type.

Furthermore, those skilled in the art will recognize that boundaries between the functionality of the above described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

All or some of the above-discussed embodiments may be implemented by software modules that perform one or more tasks associated with the embodiments. The software modules described herein may be received elements by data processing system 100, for example, from computer-readable storage media such as flash memory 106, secondary memory 108, RAM 110 and ROM 112 respectively, or other media on other computer systems. Such computer-readable storage media may be permanently, removably or remotely coupled to a data processing system. The computer-readable storage media may include non-transitory computer readable storage media, for example and without limitation, any number of the following: magnetic storage media including disk and tape storage media; optical storage media such as compact disk media (e.g., CD-ROM, CD-R, etc.) and digital video disk storage media; nonvolatile memory storage media including semiconductor-based memory units such as FLASH memory, EEPROM, EPROM, ROM; ferromagnetic digital memories; MRAM; volatile storage media including registers, buffers or caches, main memory, RAM, and the like. Other new and various types of non-transitory computer-readable storage media may be used to store the modules discussed herein. Non-transitory computer-readable storage media include all computer-readable media except for a transitory, propagating signal.

In one embodiment, data processing system 100 is a computer system such as a personal computer system. Other embodiments may include different types of computer systems. Computer systems are information handling systems which may be designed to give independent computing power to one or more users. Computer systems may be found in many forms including but not limited to mainframes, minicomputers, servers, workstations, personal computers, notepads, tablets, personal digital assistants, electronic games, automotive and other embedded systems, cell phones and various other wireless devices. A typical computer system includes at least one processing unit, associated memory and a number of input/output (I/O) devices.

A computer system processes information according to a program and produces resultant output information via I/O devices. A program is a list of instructions such as a particular application program and/or an operating system. A computer program is typically stored internally on computer readable storage medium or transmitted to the computer system via a computer readable transmission medium. A computer process typically includes an executing (running) program or portion of a program, current program values and state information, and the resources used by the operating system to manage the execution of the process. A parent process may spawn other, child processes to help perform the overall functionality of the parent process. Because the parent process specifically spawns the child processes to perform a portion of the overall functionality of the parent process, the functions performed by child processes (and grandchild processes, etc.) may sometimes be described as being performed by the parent process.

The term "bus" is used to refer to a plurality of signals or conductors which may be used to transfer one or more various types of information, such as data, addresses, control, or status. The conductors may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

In many implementations, the systems and methods disclosed herein may be incorporated into a wide range of electronic devices including, for example, computer systems or Information Technology (IT) products such as servers, desktops, laptops, memories, switches, routers, etc.; telecommunications hardware; consumer devices or appliances such as mobile phones, tablets, television sets, cameras, sound systems, etc.; scientific instrumentation; industrial robotics; medical or laboratory electronics such as imaging, diagnostic, or therapeutic equipment, etc.; transportation vehicles such as automobiles, buses, trucks, trains, watercraft, aircraft, etc.; military equipment, etc. More generally, these systems and methods may be incorporated into any device or system having one or more electronic parts or components.

Figure 7:
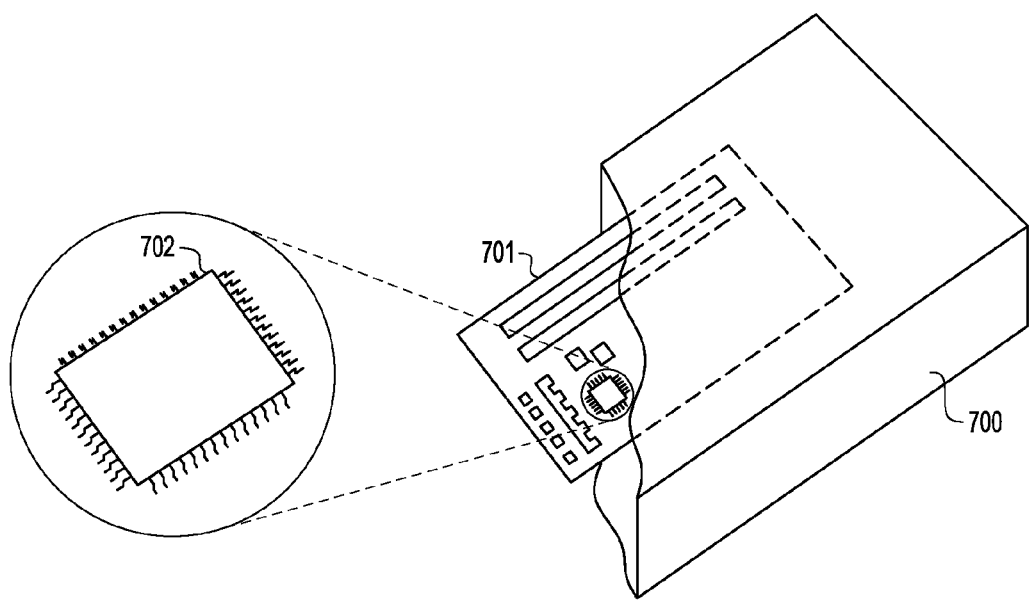
FIG. 7 illustrates an example of an electronic system having one or more electronic microelectronic device packages according to some embodiments.

Turning to FIG. 7, a block diagram of electronic system 700 is depicted. In some embodiments, electronic system 700 may include any of the aforementioned electronic devices, such as data processing system 100 or any other electronic device. As illustrated, electronic system 700 includes one or more Printed Circuit Boards (PCBs) 701, and at least one of PCBs 701 includes one or more microelectronic device packages(s) 702. In some implementations, device package(s) 702 may include one or more circuits having a memory as discussed above.

Examples of device package(s) 702 may include, for instance, a System-On-Chip (SoC), an Application Specific Integrated Circuit (ASIC), a Digital Signal Processor (DSP), a Field-Programmable Gate Array (FPGA), a processor, a microprocessor, a controller, a microcontroller (MCU), a Graphics Processing Unit (GPU), or the like. Additionally or alternatively, device package(s) 702 may include a memory circuit or device such as, for example, a Random Access Memory (RAM), a Static RAM (SRAM), a Magnetoresistive RAM (MRAM), a Nonvolatile RAM (NVRAM, such as "FLASH" memory, etc.), and/or a Dynamic RAM (DRAM) such as Synchronous DRAM (SDRAM), a Double Data Rate RAM, an Erasable Programmable ROM (EPROM), an Electrically Erasable Programmable ROM (EEPROM), etc. Additionally or alternatively, device package(s) 702 may include one or more mixed-signal or analog circuits, such as, for example, Analog-to-Digital Converter (ADCs), Digital-to-Analog Converter (DACs), Phased Locked Loop (PLLs), oscillators, filters, amplifiers, etc. Additionally or alternatively, device package(s) 702 may include one or more MicroElectroMechanical Systems (MEMS), Nano-ElectroMechanical Systems (NEMS), or the like.

Generally speaking, device package(s) 702 may be configured to be mounted onto PCB 701 using any suitable packaging technology such as, for example, Ball Grid Array (BGA) packaging or the like. In some applications, PCB 701 may be mechanically mounted within or fastened onto electronic device 700. It should be noted that, in certain implementations, PCB 701 may take a variety of forms and/or may include a plurality of other elements or components in addition to device package(s) 702. It should also be noted that, in some embodiments, PCB 701 may not be used and/or device package(s) 702 may assume any other suitable form(s).

As discussed herein, in an illustrative, non-limiting embodiment, a memory device may include a first memory having a plurality of address locations, each of the plurality of address locations having a number of storage bits configured to store data and one or more error correction bits corresponding to the data; and a second memory distinct from the first memory, the second memory having a plurality of entries, each of the plurality of entries configured to store one or more operation code bits relating to data stored at a corresponding address location in the first memory, the one or more operation code bits identifying an error correction scheme used to generate the one or more error correction bits at the corresponding address location in the first memory. For example, each of the plurality of address locations may be a page within the first memory. Additionally or alternatively, each of the plurality of address locations may be a block within the first memory, each block comprising a plurality of pages.

A logic circuit may be coupled to the first and second memory circuits, the logic circuit configured to: determine that data stored at a given address location of the first memory includes a number of data corruption errors that exceeds a correction capability of a first correction scheme identified by a first operation code stored in a corresponding entry of the second memory; in response to the determination, select a second correction scheme capable of correcting the number of data corruption errors; and update the corresponding entry of the second memory with a second operation code identifying the second correction scheme.

In some implementations, the first and second memories may include non-volatile memories, and the logic circuit includes a memory controller. The first correction scheme may include a Reed-Solomon code or a MOLS code, and the second correction scheme may include a BCH code. Alternatively, the first correction scheme may include a BCH code, and the second correction scheme includes an LDPC code. Selection of the second correction scheme may follow a predetermined sequence of correction schemes ordered from least to most computationally complex.

The logic circuit may be further configured to select the second correction scheme for another address location independently of whether the first correction scheme is capable of correcting data corruption errors in the other address location, and where the address location and the other address location are part of a same block within the first memory. The logic circuit may be further configured to, in response to a determination that a most complex correction scheme is not capable of correcting the number of corruption errors, flag the given address location of the first memory as unusable. The logic circuit may be further configured to flag another address location as unusable independently of whether the most complex correction scheme is capable of correcting other data corruption errors in the other address location, and where the given address location and the other address location are part of a same block within the first memory.

In another illustrative, non-limiting embodiment, a method may include storing data at a plurality of address locations within a first memory, where each of the plurality of address locations has a number of storage bits configured to store data and one or more error correction bits corresponding to the data; and storing an operation code at each of a plurality of entries of a second memory, each operation code relating to data stored at a corresponding address location in the first memory, where each operation code is usable to identify an error correction scheme used to generate one or more error correction bits in a corresponding address location of the first memory.

The method may include determining that data stored at a given address location of the first memory includes a number of data corruption errors that exceeds a correction capability of a first correction scheme identified by a first operation code stored in a corresponding entry of the second memory; selecting a second correction scheme capable of correcting the number of data corruption errors; and updating the corresponding entry of the second memory with a second operation code identifying the second correction scheme.

The method may also include determining that the data has a number of data corruption errors; determining that none of a set of available correction schemes is capable of correcting the number of corruption errors; and flagging the given address location as unusable. The method may further include flagging another address location as unusable independently of whether any of the available correction schemes is capable of correcting data corruption errors in the data stored at the other address location, where the address location and the other address location are part of a same block within the first memory.

In some implementations, the method may include selecting the second correction scheme for data stored at another address location independently of whether the first correction scheme is capable of correcting data corruption errors in the other address location, where the address location and the other address location are part of a same block within the first memory. The method may also include determining that data stored at the given address location of the first memory includes an additional number of data corruption errors that exceeds a correction capability of the second correction scheme; selecting a third correction scheme capable of correcting the additional number of data corruption errors; and updating the corresponding entry of the second memory with a third operation code identifying the third correction scheme. For example, the first correction scheme may include a Reed-Solomon code or a MOLS code, the second correction scheme may include a BCH code, and the third correction scheme may include an LDPC code.

In yet another embodiment, and electronic device may include a controller; and a memory having program instructions stored thereon that, upon execution by the controller, cause the electronic device to: determine that data stored at a given address of a first memory has a number of data corruption errors that exceeds a correction capability of a first correction scheme identified by a first operation code stored in an entry of a second memory that corresponds to the address of the first memory; select a second correction scheme capable of correcting the number of data corruption errors, where the second correction scheme is computationally more complex than the first correction scheme; and update the corresponding entry of the second memory with a second operation code identifying the second correction scheme. The program instructions, upon execution by the controller, may further cause the electronic device to select the second correction scheme for another address of the first memory independently of whether the first correction scheme is capable of correcting data corruption errors in the other address.

Although the invention(s) is/are described herein with reference to specific embodiments, various modifications and changes can be made without departing from the scope of the present invention(s), as set forth in the claims below. Accordingly, the specification and figures are to be regarded in an illustrative rather than a restrictive sense, and all such modifications are intended to be included within the scope of the present invention(s). Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements. The term "coupled" is defined as connected, although not necessarily directly, and not necessarily mechanically. The terms "a" and "an" are defined as one or more unless stated otherwise. The terms "comprise" and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a system, device, or apparatus that "comprises," "has," "includes" or "contains" one or more elements possesses those one or more elements but is not limited to possessing only those one or more elements. Similarly, a method or process that "comprises," "has," "includes" or "contains" one or more operations possesses those one or more operations but is not limited to possessing only those one or more operations.

The invention claimed is:

1. A memory device, comprising:
    a first memory having a plurality of address locations, each of the plurality of address locations having a number of storage bits configured to store data and one or more error correction bits corresponding to the data;
    a second memory distinct from the first memory, the second memory having a plurality of entries, each of the plurality of entries configured to store one or more operation code bits relating to data stored at a corresponding address location in the first memory, the one or more operation code bits identifying an error correction scheme used to generate the one or more error correction bits at the corresponding address location in the first memory; and
    a logic circuit coupled to the first and second memory circuits, the logic circuit configured to:
        determine that data stored at a given address location of the first memory includes a number of data corruption errors that exceeds a correction capability of a first correction scheme identified by a first operation code stored in a corresponding entry of the second memory;
        in response to the determination, select a second correction scheme capable of correcting the number of data corruption errors;
        update the corresponding entry of the second memory with a second operation code identifying the second correction scheme; and
        select the second correction scheme for another address location independently of whether the first correction scheme is capable of correcting data corruption errors in the other address location.

2. The memory device of claim 1, wherein each of the plurality of address locations is a page within the first memory.

3. The memory device of claim 1, wherein each of the plurality of address locations is a block within the first memory, each block comprising a plurality of pages.

4. The memory device of claim 1, wherein the first and second memories include non-volatile memories, and wherein the logic circuit includes a memory controller.

5. The memory device of claim 1, wherein the first correction scheme includes a Reed-Solomon code or a Mutually Orthogonal Latin Squares (MOLS) code, and wherein the second correction scheme includes a Bose-Chaudhuri-Hocquenghem (BCH) code.

6. The memory device of claim 1, wherein the first correction scheme includes a Bose-Chaudhuri-Hocquenghem (BCH) code, and wherein the second correction scheme includes a Low-Density Parity-Check (LDPC) code.

7. The memory device of claim 1, wherein selection of the second correction scheme follows a predetermined sequence of correction schemes ordered from least to most computationally complex.

8. The memory device of claim 1, wherein the address location and the other address location are part of a same block within the first memory.

9. The memory device of claim 1, wherein the logic circuit is further configured to, in response to a determination that a most complex correction scheme is not capable of correcting the number of corruption errors, flag the given address location of the first memory as unusable.

10. The memory device of claim 9, wherein the logic circuit is further configured to flag another address location as unusable independently of whether the most complex correction scheme is capable of correcting other data corruption errors in the other address location, and wherein the given address location and the other address location are part of a same block within the first memory.

11. A method, comprising:
   storing data at a plurality of address locations within a first memory, wherein each of the plurality of address locations has a number of storage bits configured to store data and one or more error correction bits corresponding to the data;
   storing an operation code at each of a plurality of entries of a second memory, each operation code relating to data stored at a corresponding address location in the first memory, wherein each operation code is usable to identify an error correction scheme used to generate one or more error correction bits in a corresponding address location of the first memory;
   determining that data stored at a given address location of the first memory includes a number of data corruption errors that exceeds a correction capability of a first correction scheme identified by a first operation code stored in a corresponding entry of the second memory;
   selecting a second correction scheme capable of correcting the number of data corruption errors;
   updating the corresponding entry of the second memory with a second operation code identifying the second correction scheme; and
   selecting the second correction scheme for data stored at another address location independently of whether the first correction scheme is capable of correcting data corruption errors in the other address location.

12. The method of claim 11, further comprising:
   determining that the data has a number of data corruption errors;
   determining that none of a set of available correction schemes is capable of correcting the number of corruption errors; and
   flagging the given address location as unusable.

13. The method of claim 12, further comprising flagging another address location as unusable independently of whether any of the available correction schemes is capable of correcting data corruption errors in the data stored at the other address location, wherein the address location and the other address location are part of a same block within the first memory.

14. The method of claim 11, wherein the address location and the other address location are part of a same block within the first memory.

15. The method of claim 11, further comprising: determining that data stored at the given address location of the first memory includes an additional number of data corruption errors that exceeds a correction capability of the second correction scheme; selecting a third correction scheme capable of correcting the additional number of data corruption errors; and updating the corresponding entry of the second memory with a third operation code identifying the third correction scheme.

16. The method of claim 15, wherein the first correction scheme includes a Reed-Solomon code or a Mutually Orthogonal Latin Squares (MOLS) code, the second correction scheme includes a Bose-Chaudhuri-Hocquenghem (BCH) code, and the third correction scheme includes a Low-Density Parity-Check (LDPC) code.

17. An electronic device, comprising:
   a controller; and
   a memory having program instructions stored thereon that, upon execution by the controller, cause the electronic device to:
      determine that data stored at a given address of a first memory has a number of data corruption errors that exceeds a correction capability of a first correction scheme identified by a first operation code stored in an entry of a second memory that corresponds to the address of the first memory;
      select a second correction scheme capable of correcting the number of data corruption errors, wherein the second correction scheme is computationally more complex than the first correction scheme;
      update the corresponding entry of the second memory with a second operation code identifying the second correction scheme; and
      select the second correction scheme for another address of the first memory independently of whether the first correction scheme is capable of correcting data corruption errors in the other address.

* * * * *